(12) United States Patent
Czubatyj

(10) Patent No.: US 7,923,724 B2
(45) Date of Patent: Apr. 12, 2011

(54) PHASE CHANGE MEMORY THAT SWITCHES BETWEEN CRYSTALLINE PHASES

(75) Inventor: Wolodymyr Czubatyj, Warren, MI (US)

(73) Assignee: Ovonyx, Inc., Troy, MI (US)

( * ) Notice: Subject to any disclaimer, the term of this patent is extended or adjusted under 35 U.S.C. 154(b) by 251 days.

(21) Appl. No.: 11/032,345

(22) Filed: Jan. 10, 2005

(65) Prior Publication Data
US 2006/0151849 A1  Jul. 13, 2006

(51) Int. Cl.
*H01L 29/04* (2006.01)
*H01L 31/036* (2006.01)

(52) U.S. Cl. ............ 257/49; 257/50; 257/52; 365/148; 365/163

(58) Field of Classification Search ............ 257/49, 257/50, 51, 52; 365/148, 163, 189
See application file for complete search history.

(56) References Cited

U.S. PATENT DOCUMENTS

| 7,005,665 B2* | 2/2006 | Furkay et al. ........... 257/2 |
| 7,589,343 B2* | 9/2009 | Lowrey .................. 257/4 |
| 2002/0154531 A1* | 10/2002 | Lowrey et al. ........ 365/100 |
| 2005/0088872 A1* | 4/2005 | Ma ...................... 365/148 |
| 2006/0109042 A1* | 5/2006 | Hsu et al. ............ 327/276 |

* cited by examiner

*Primary Examiner* — Phuc T Dang
(74) *Attorney, Agent, or Firm* — Trop, Pruner & Hu, P.C.

(57) ABSTRACT

A phase change memory may transition between two crystalline states. In one embodiment, the phase change material is a chalcogenide which transitions between face centered cubic and hexagonal states. Because these states are more stable, they are less prone to drift than the amorphous state conventionally utilized in phase change memories.

13 Claims, 3 Drawing Sheets

PHASE CHANGE MEMORY THAT SWITCHES BETWEEN CRYSTALLINE PHASES

BACKGROUND

This invention relates generally to phase change memories.

In conventional phase change memories, a memory material, such as a chalcogenide, may switch between crystalline and non-crystalline or so-called amorphous phases. One problem with these transitions is that particularly the amorphous phase is not very stable. As a result, the characteristics of the device in the amorphous phase may drift.

Commonly, a phase change memory transitions between the amorphous phase and a crystalline phase which may be a face centered cubic (FCC) phase.

Thus, there is a need for ways to transition phase change memories between states that are less subject to drift.

DETAILED DESCRIPTION

Figure 1:
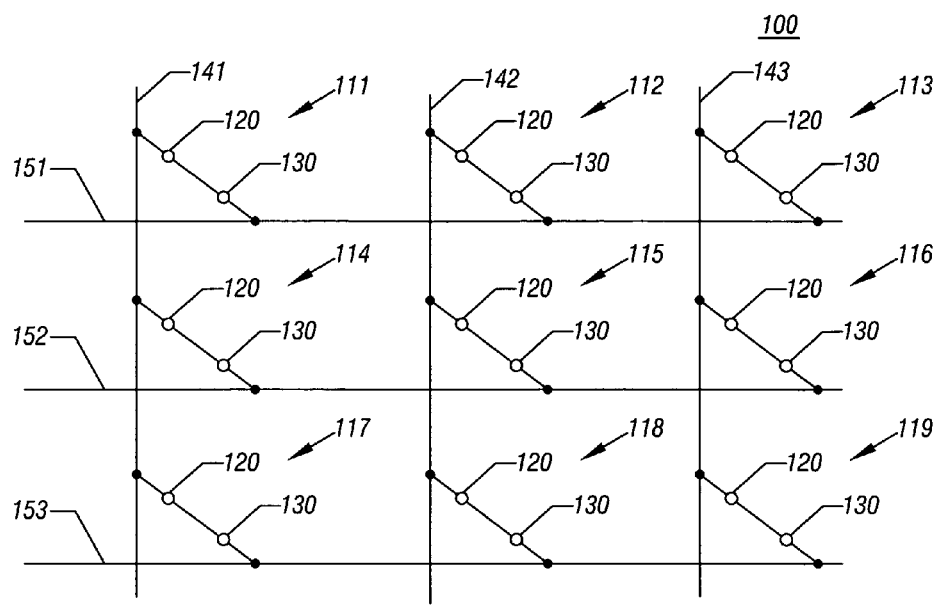
FIG. 1 is a schematic depiction of one embodiment of the present invention.

Turning to FIG. 1, an embodiment of a memory 100 is illustrated. Memory 100 may include a 3×3 array of memory cells 111-119, wherein memory cells 111-119 each include a select device 120 and a memory element 130. Although a 3×3 array is illustrated in FIG. 1, the scope of the present invention is not limited in this respect. Memory 100 may have a larger array of memory cells.

In one embodiment, memory elements 130 may comprise a phase change material. In this embodiment, memory 100 may be referred to as a phase change memory. A phase change material may be a material having electrical properties (e.g. resistance, capacitance, etc.) that may be changed through the application of energy such as, for example, heat, light, voltage potential, or electrical current. Examples of a phase change material may include a chalcogenide material.

A chalcogenide alloy may be used in a memory element or in an electronic switch. A chalcogenide material may be a material that includes at least one element from column VI of the periodic table or may be a material that includes one or more of the chalcogen elements, e.g., any of the elements of tellurium, sulfur, oxygen, or selenium.

Memory 100 may include column lines 141-143 and row lines 151-153 to select a particular memory cell of the array during a write or read operation. Column lines 141-143 and row lines 151-153 may also be referred to as address lines since these lines may be used to address memory cells 111-119 during programming or reading. Column lines 141-143 may also be referred to as bit lines and row lines 151-153 may also be referred to as word lines.

Memory elements 130 may be connected to row lines 151-153 and may be coupled to column lines 141-143 via select device 120. While one select device 120 is depicted, more select devices may also be used. Therefore, when a particular memory cell (e.g., memory cell 115) is selected, voltage potentials may be applied to the memory cell's associated column line (e.g., 142) and row line (e.g., 152) to apply a voltage potential across the memory cell.

Series connected select device 120 may be used to access memory element 130 during programming or reading of memory element 130. The select device 120 can be a diode or a transistor, as two examples. Select device 120 may also be referred to as an access device, an isolation device, or a switch.

Figure 2:
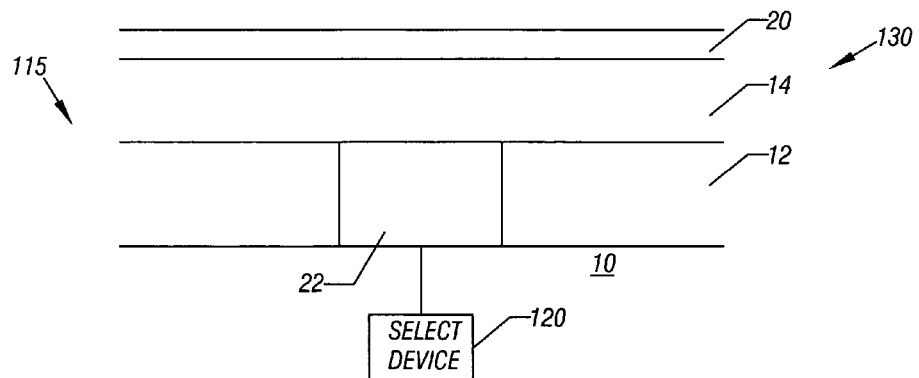
FIG. 2 is an enlarged, partially cross-sectional and partially schematic view of one cell shown in FIG. 1 in accordance with one embodiment of the present invention.

Referring to FIGS. 1 and 2, a cell 115 may include a memory element 130 and a select device 120. The select device 120 may, for example, be a field effect transistor or a diode. The select device 120 is coupled to a lower electrode 22 formed in an insulating layer 12. A memory material 14 may be formed thereover. An upper electrode 20 may extend transversely to the length of the lower electrode 22 in one embodiment.

The memory material may, for example, be a chalcogenide known as GST 2,2,5, or $Ge_2Sb_2Te_5$, which is 20% germanium, 20% antimony, and 50% tellurium. In response to current-based Joule heating, the memory material 14 transitions between two different crystalline states. In one embodiment, the memory material 14 may transition between a more resistive face centered cubic (FCC) crystalline state (indicated in FIG. 3) and an even less resistive hexagonal state (also indicated in FIG. 3).

Figure 3:
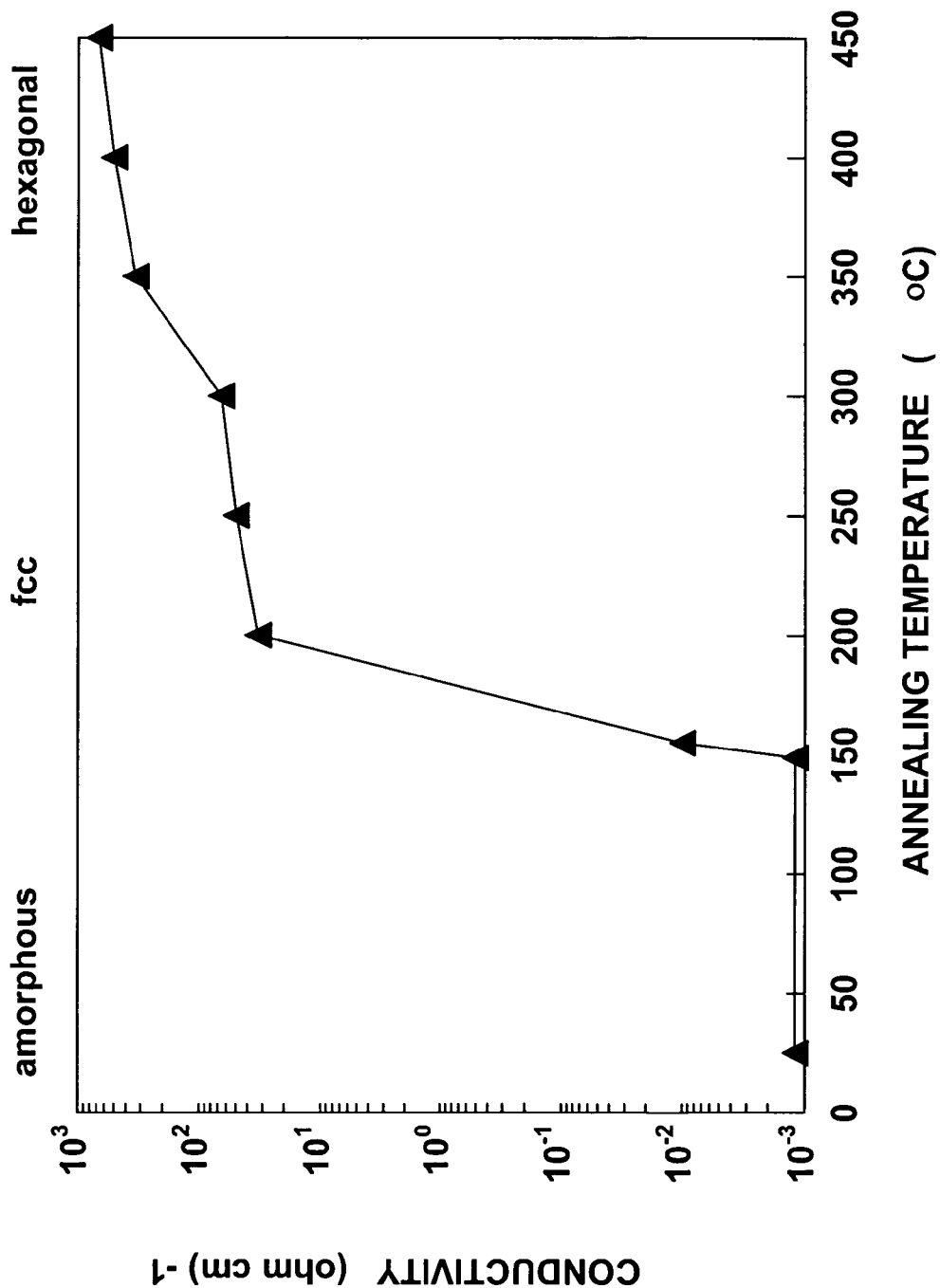
FIG. 3 is a typical graph of conductivity versus annealing temperature.
Figure 4:
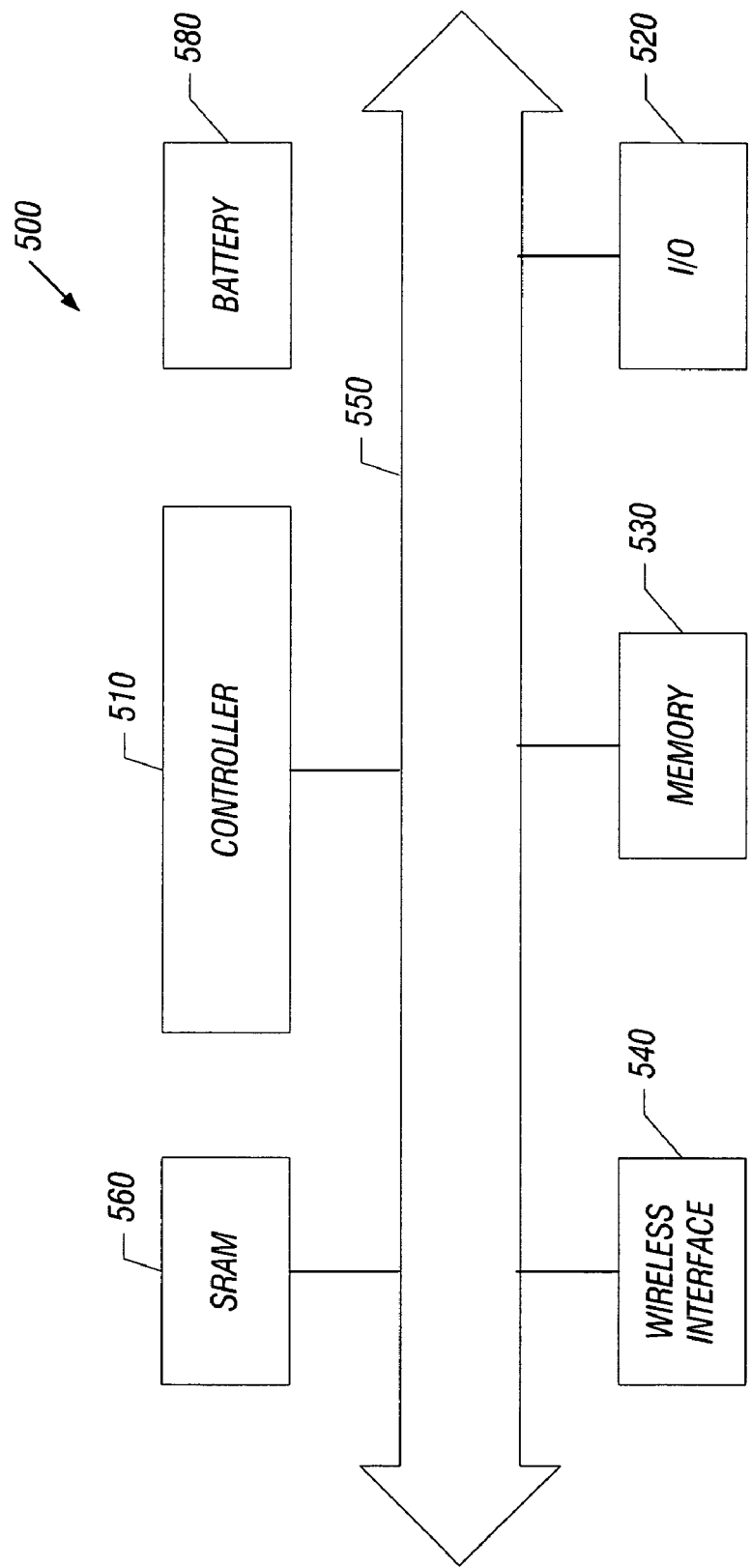
FIG. 4 is a system depiction of one embodiment of the present invention.

In the hexagonal state, very low resistance and relatively high conductivity on the order of 500 to 2000 $(ohm-cm)^{-1}$ may be achieved as indicated in FIG. 3. Generally, the material 14 is heated to a temperature of above 350 degrees and held at that temperature for sufficient time to transition to the hexagonal state. Thus, in some cases, a relatively longer amount of time and more heat may be utilized to transition to the hexagonal state. However, in the hexagonal state, the structure is extremely stable and drift is very low, or not measureable.

To transition back from the hexagonal state to the face centered cubic state, a conventional reset operation may be utilized. In other embodiments, it may be desirable to reset and then to transition to a face centered cubic state. Thus, a two-step reset may be required wherein the initial step is a reset as is conventionally done, followed by a set operation to transition the device to the face centered cubic state.

In conventional phase change memories, the face centered cubic state may also be utilized, but it is the only crystalline state that is achieved. Generally, those devices transition between face centered cubic and an amorphous phase, neither of which is as stable and as drift resistant as the hexagonal state.

Programming of phase change material 18 to alter the state or phase of the material may be accomplished by applying voltage potentials to conductive materials 22 and 20, thereby generating a voltage potential across the memory element 120 and select device 130. When the voltage potential is greater than the threshold voltage of the memory element 120, then an electrical current may flow through memory material 14 in response to the applied voltage potential, and may result in heating of memory material 14.

This heating may alter the memory state or phase of memory material 14. Altering the phase or state of memory material 14 may alter an electrical characteristic of memory material 14, e.g., the resistance of the material may be altered by altering the phase of the memory material 14.

In the "reset" state, memory material 14 may be in a face centered cubic crystalline state and in the "set" state, memory material 14 may be in an a hexagonal crystalline state. The resistance of memory material 14 in the face centered cubic state may be greater than the resistance of memory material 14 in the hexagonal crystalline state. It is to be appreciated that the association of reset and set with crystalline states is a convention and that at least an opposite convention may be adopted.

Using electrical current, memory material 14 may be heated to a relatively higher temperature to "reset" memory material 14 (e.g., program memory material 18 to a logic "0" value). Heating the volume of memory material 14 to a relatively higher crystallization temperature may crystallize memory material 18 and "set" memory material 14 (e.g., program memory material 18 to a logic "1" value).

Conductive material 20, 22 may be a thin film material having a thickness ranging from about 20 Å to about 2000 Å. In one embodiment, the thickness of the material 20, 22 may range from about 100 Å to about 1000 Å. In another embodiment, the thickness of the material 20, 22 may be about 300 Å. Suitable materials may include a thin film of titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with material 14.

Turning to FIG. 3, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 860, and may be used to store user data. Memory 875 may be provided by one or more different types of memory. For example, memory 530 may comprise any type of random access memory, a volatile memory, a non-volatile memory such as a flash memory and/or a memory such as memory 100 discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
a pair of conductors; and
a phase change memory material programmable to two different crystalline states, said material located between said conductors.

2. The memory of claim 1 wherein said material is a chalcogenide.

3. The memory of claim 2 wherein said material includes $Ge_2Sb_2Te_5$.

4. The memory of claim 1, said device to transition to the hexagonal crystalline state.

5. The memory of claim 3 wherein said device to transition between hexagonal and face centered cubic crystalline states.

6. The memory of claim 1 including a select device.

7. The memory of claim 1 wherein said memory is not programmable to an amorphous state.

8. A phase change memory comprising:
a pair of conductors; and
a phase change memory material having two different stable crystalline states, said material located between said conductors.

9. The memory of claim 8 wherein said material is a chalcogenide.

10. The memory of claim 9 wherein said material includes $Ge_2Sb_2Te_5$.

11. The memory of claim 8, said device to transition to the hexagonal crystalline state.

12. The memory of claim 11 wherein said device to transition between hexagonal and face centered cubic crystalline states.

13. The memory of claim 8 including a select device.

* * * * *